(12) United States Patent
Tu

(10) Patent No.: US 8,004,870 B2
(45) Date of Patent: Aug. 23, 2011

(54) MEMORY CHIPS AND JUDGMENT CIRCUITS THEREOF

(75) Inventor: Ying-Te Tu, Kaohsiung (TW)

(73) Assignee: Winbond Electronics Corp., Taichung County (TW)

( * ) Notice: Subject to any disclaimer, the term of this patent is extended or adjusted under 35 U.S.C. 154(b) by 106 days.

(21) Appl. No.: 12/647,232

(22) Filed: Dec. 24, 2009

(65) Prior Publication Data

US 2011/0157950 A1 Jun. 30, 2011

(51) Int. Cl.
*G11C 5/06* (2006.01)
(52) U.S. Cl. ............................ 365/63; 365/189.05
(58) Field of Classification Search ............ 365/63, 365/189.05
See application file for complete search history.

(56) References Cited

U.S. PATENT DOCUMENTS

| | | | |
|---|---|---|---|
| 4,987,325 A | | 1/1991 | Seo |
| 5,201,036 A | * | 4/1993 | Yoshimatsu ............... 710/107 |
| 5,587,995 A | * | 12/1996 | Takebe et al. ............... 370/248 |
| 5,621,343 A | * | 4/1997 | Yamauchi ............... 327/172 |
| 5,736,948 A | * | 4/1998 | Mitsuishi et al. ............ 341/141 |
| 6,225,836 B1 | | 5/2001 | Kitade |
| 2002/0145669 A1 | * | 10/2002 | Umeda et al. ............. 348/220.1 |
| 2005/0216676 A1 | * | 9/2005 | Takahashi et al. ............ 711/145 |
| 2007/0115759 A1 | * | 5/2007 | Sano .............................. 368/47 |

* cited by examiner

*Primary Examiner* — Michael Tran
(74) *Attorney, Agent, or Firm* — Muncy, Geissler, Olds & Lowe, PLLC

(57) ABSTRACT

A memory chip is provided. The memory chip operates at modes and includes an option pad and a judgment circuit. The judgment circuit is coupled to the option pad generates a judgment signal according to the current status of the option pad. The judgment signal indicates which mode the memory chip is operating at. The judgment circuit includes a detection unit and a sampling unit. The detection unit is coupled to a first voltage source and the option pad and further controlled by a control signal to generate at least one detection signal according to the current status of the option pad. The sampling unit samples the at least one detection signal after the control signal is asserted to generate the judgment signal. When the control signal is asserted, a level of the at least one detection signal is varied by a voltage provided by the first voltage source.

12 Claims, 10 Drawing Sheets

MEMORY CHIPS AND JUDGMENT CIRCUITS THEREOF

BACKGROUND OF THE INVENTION

1. Field of the Invention

The invention relates to a memory chip, and more particularly to a judgment circuit for judging that a memory chip is operating as a single memory die or one among stacked memory dies according to statuses of an option pad of the memory chip.

2. Description of the Related Art

FIG. 1 is a schematic view showing a 256 Mb memory chip. Referring to FIG. 1, the memory chip 1 comprises 23 address pads A0~A22, an option pad OP, and a dummy pad NC. When the memory chip 1 operates as a single memory die, both of the option pad OP and the dummy pad NC are floating. A weak pulling high/low circuit on the inside of the memory chip 1 gradually pulls an internal node which is connected with the option pad OP to a high/low voltage level. In the following description, a weak pulling high circuit and a weak pulling high operation for the option pad OP are given as an example.

In some applications, at least two memory chips 1, as shown in FIG. 1, can be stacked to form a memory device. As shown in FIG. 2, a 512 Mb memory device 2 having two stacked memory chips 20 and 21 of 256 Mb is given as an example. Each of the stacked memory chips 20 and 21 has the same structure as the memory chip 1 of FIG. 1, and the dummy pad NC of the memory chip 1 serves as the $24^{th}$ address pad A23 for addressing the two memory chips 20 and 21. The top memory chip 20 is stacked on the bottom memory chip 21, and a spacer 23 is therebetween. FIG. 3 is a schematic view showing connection between the address pads A0~A23 of the memory chips 20 and 21. In order to clearly show the connection, the memory chips 20 and 21 are shown side by side, and, however, in practice, the top memory chip 20 is stacked on the bottom memory chip 21, as shown in FIG. 2. Referring to FIG. 3, the address pads A0~A23 of the memory chip 20 are connected to the address pads A0~A23 of the memory chip 21 at address pads A0'~A23' respectively. The memory chips 20 and 21 receive an address signal through the address pads A0'~A23'.

In FIG. 3, the option pad OP of the top memory chip 20 is tied to a high voltage source VDD, and an internal node connected to the option pad OP thereof is thus at a high level. The option pad OP of the bottom memory chip 21 is tied to a low voltage source VSS, and an internal node connected to the option pad OP thereof is thus at a low voltage level. Thus, when the address pad A23' receives a logic high signal (H), the top memory chip 20 is activated and the bottom memory chip 21 is inactivated. Contrarily, when the address pad A23' receives a low signal (L), the bottom memory chip 21 is activated and the top memory chip 20 is inactivated.

Thus, one memory chip, such as the memory chips 20 and 21, can operate at three modes according to the status of its option pad. At the first mode, the memory chip operates as a single memory die when the option pad OP thereof is floating; at the second mode, the memory chip operates as a top memory die among two stacked memory dies when the option pad OP thereof is tied to the high voltage source VDD; and at the third mode, the memory chip operates as a bottom memory die among two stacked memory dies when the option pad OP thereof is tied to the voltage source VSS. At the three modes, the internal node connected to the option pad OP of the memory chip is weakly pulled high, strongly pulled high, and strongly pulled low respectively. According to the above description, when one memory chip operates at the first mode and the second mode, an internal node connected to an option pad OP of the memory chip is pulled high. Thus, when the internal node is at a high level, the memory chip itself can not determine that it is operating as a single memory die (first mode) or as a top memory die among two stacked memory dies (second mode). This situation may occur to one memory chip desiring to be a top memory die among two stacked memory dies, such as the top memory chip 20 in FIG. 2.

Assume that a weak pulling low circuit and a weak pulling low operation are applied for floating of the option pad OP. According to the above description, when one memory chip operates at the first mode and the third mode, an internal node connected to an option pad OP of the memory chip is pulled low. Thus, when the internal node is at a low voltage level, the memory chip itself can not determine that it is operating as a single memory die (first mode) or as a bottom memory die among two stacked memory dies (third mode). This situation may occur to one memory chip desiring to be a bottom memory chip among two stacked memory dies, such as the bottom memory chip 21 in FIG. 2.

Thus, it is desired to provide a judgment circuit for judging that a memory chip is operating as a single memory die or one among stacked memory dies.

BRIEF SUMMARY OF THE INVENTION

An exemplary embodiment of a memory chip is provided. The memory chip operates at a plurality of modes. The memory chip comprises an option pad and a judgment circuit. The option pad has a plurality of statuses. The judgment circuit is coupled to the option pad. The judgment circuit generates a judgment signal according to the current status of the option pad, wherein the judgment signal indicates which mode the memory chip is operating at. The judgment circuit comprises a detection unit and a sampling unit. The detection unit is coupled to a first voltage source and the option pad and further controlled by a control signal to generate at least one detection signal according to the current status of the option pad. The sampling unit receives the at least one detection signal and samples the at least one detection signal after the control signal is asserted to generate the judgment signal. When the control signal is asserted, a level of the at least one detection signal is varied by a voltage provided by the first voltage source.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

Figure 5:
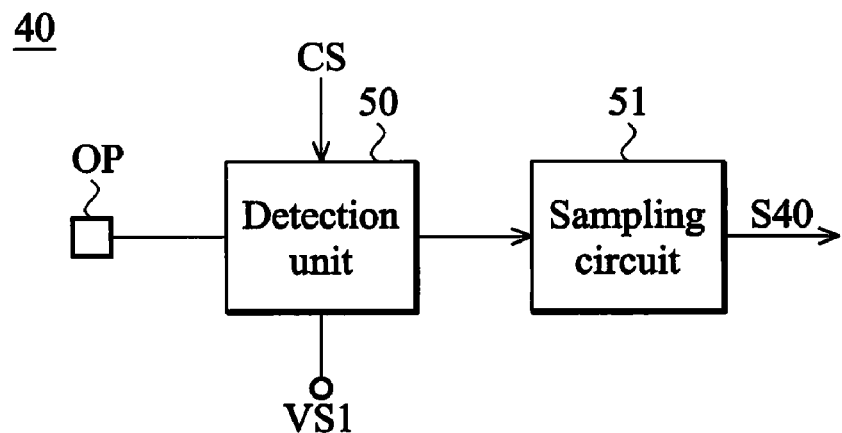
FIG. 5 shows an exemplary embodiment of the judgment circuit 40 in FIG. 4.
Figure 6:
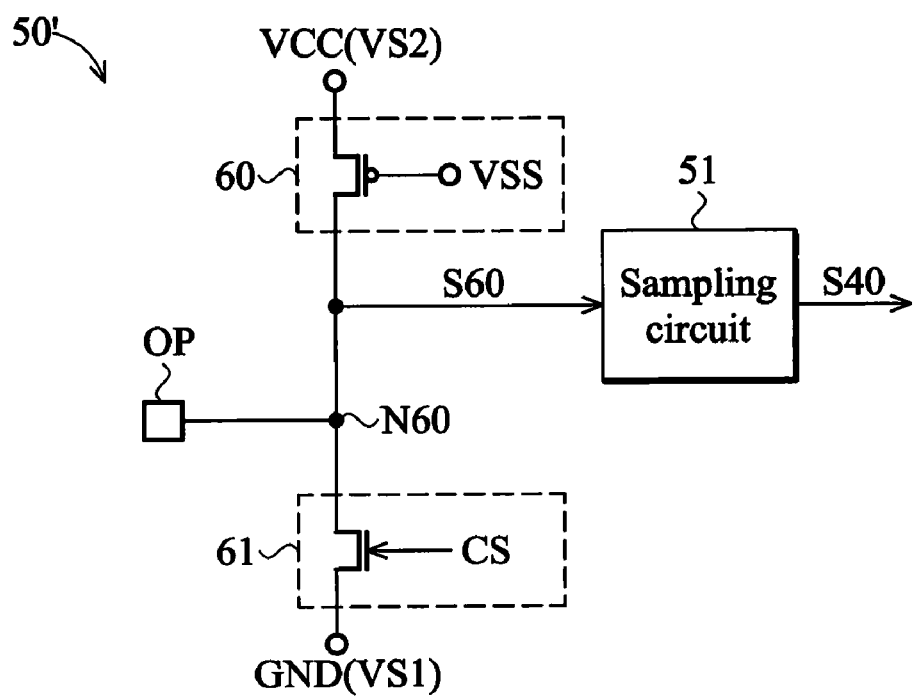
FIG. 6 shows an exemplary embodiment of the detection unit 50 in FIG. 5.
Figure 7A:
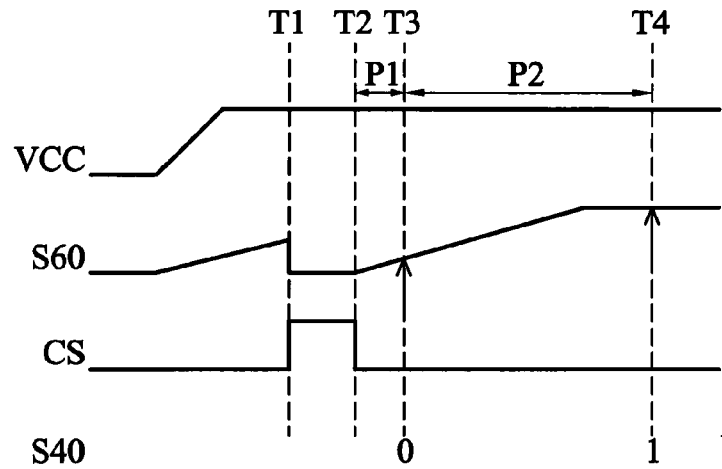
FIG. 7a shows wave forms of the voltage of the voltage source VCC (VS2), the control signal CS, and the detection signal S60 and the logic values of the judgment signal S40 when the memory chip 4 is operating as a single memory die (the first mode) in the embodiment of FIG. 6.
Figure 7B:
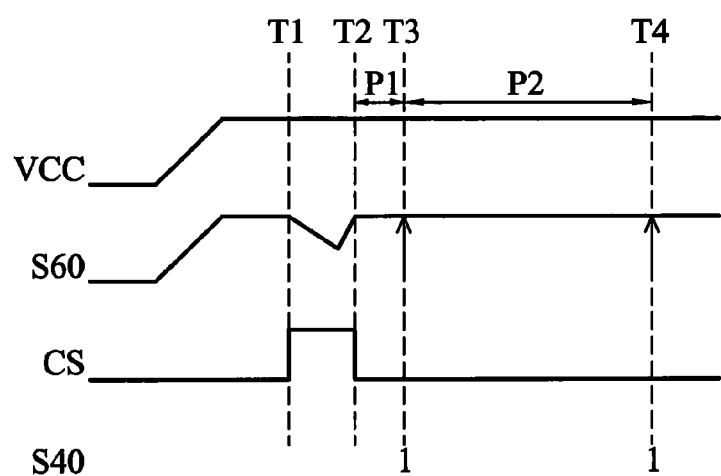
Figure 7C:
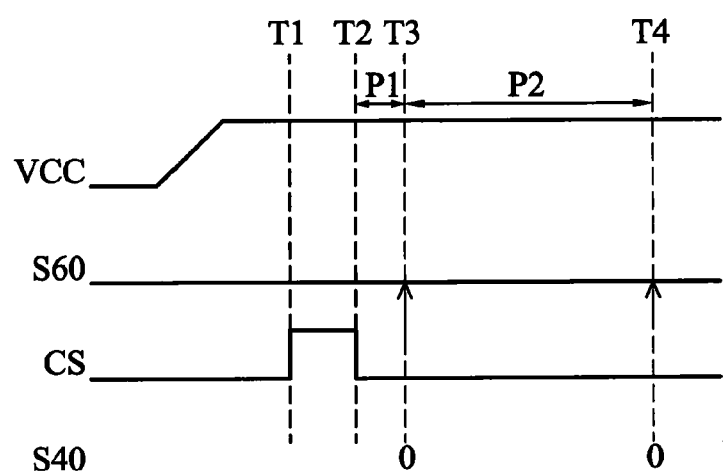
Figure 8:
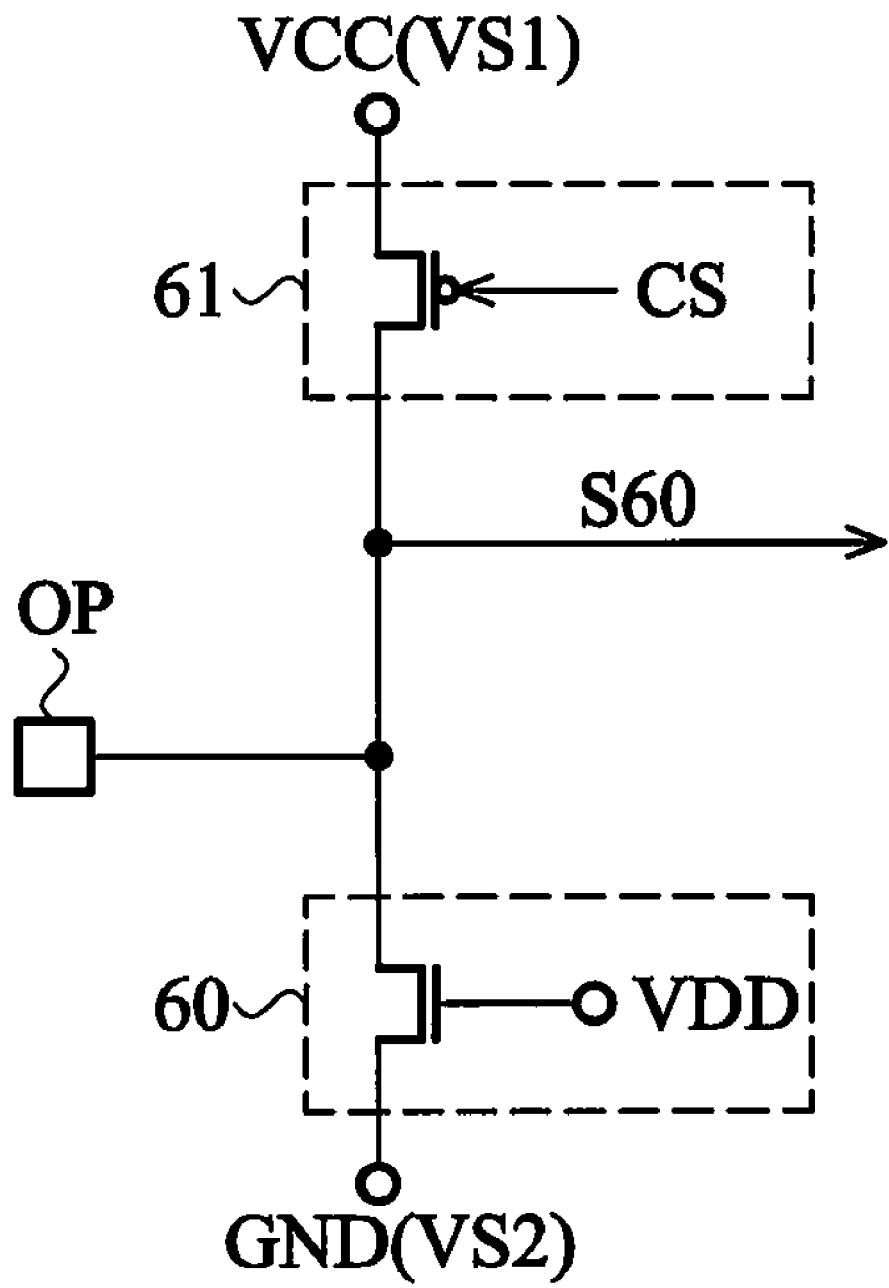
Figure 9A:
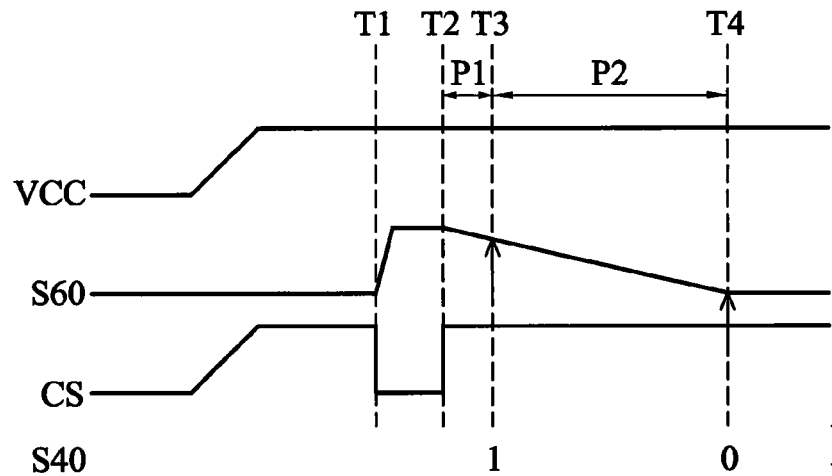
Figure 9B:
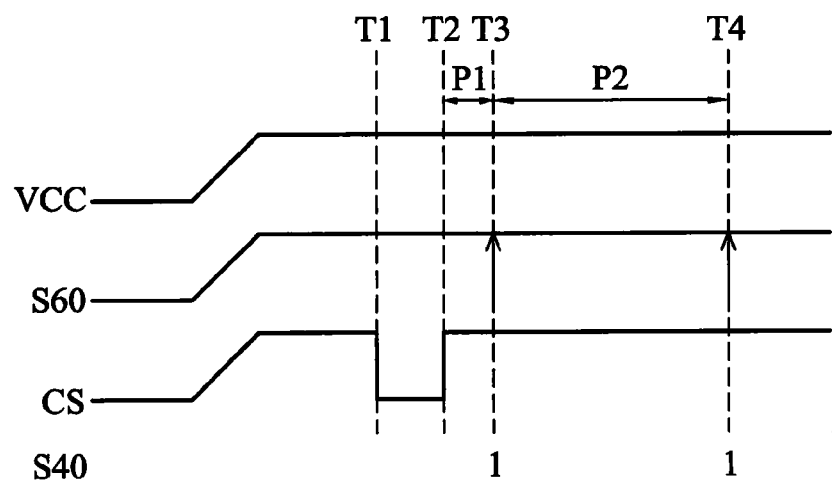
Figure 9C:
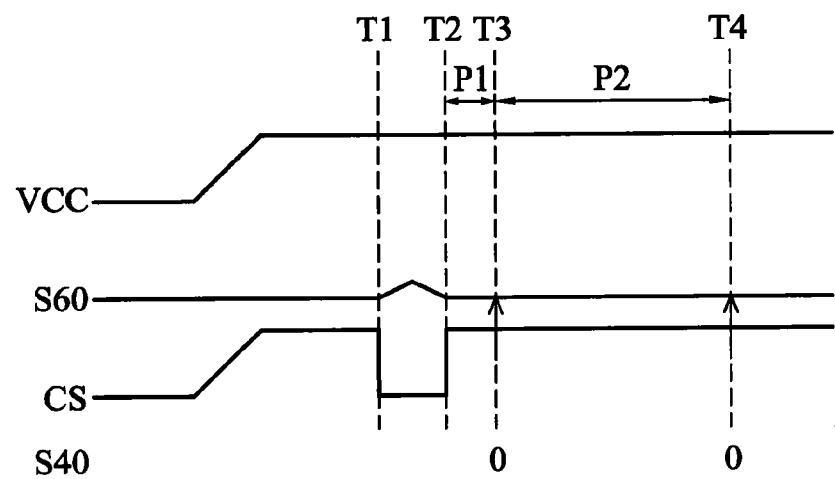
Figure 10:
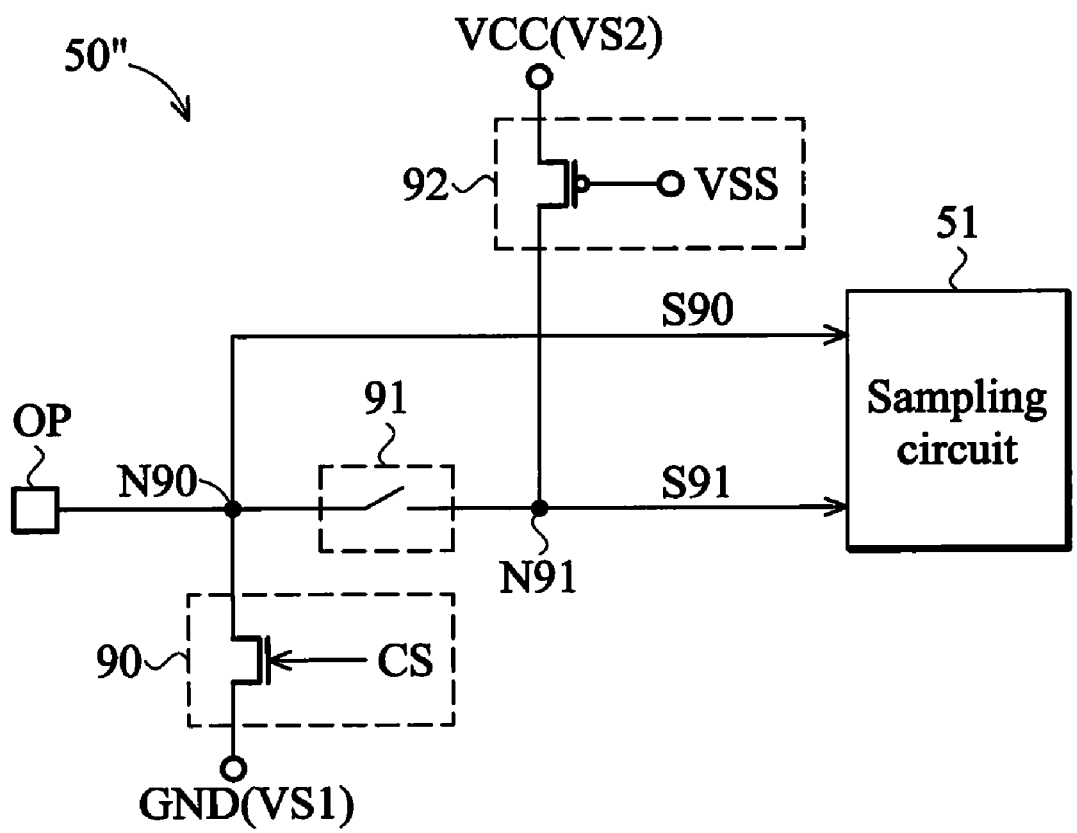
Figure 11A:
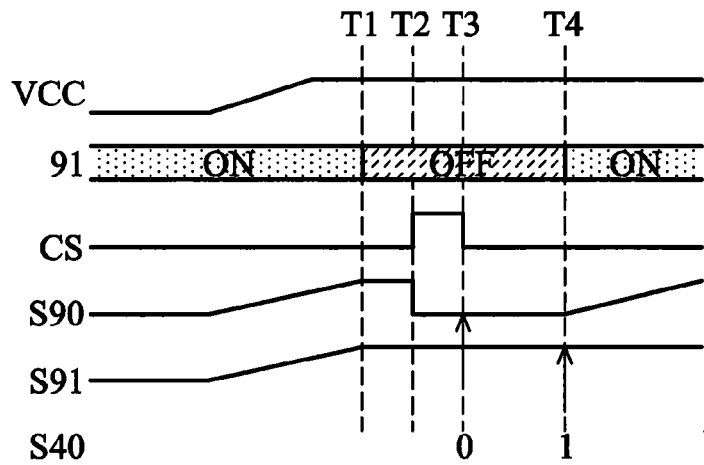
Figure 11B:
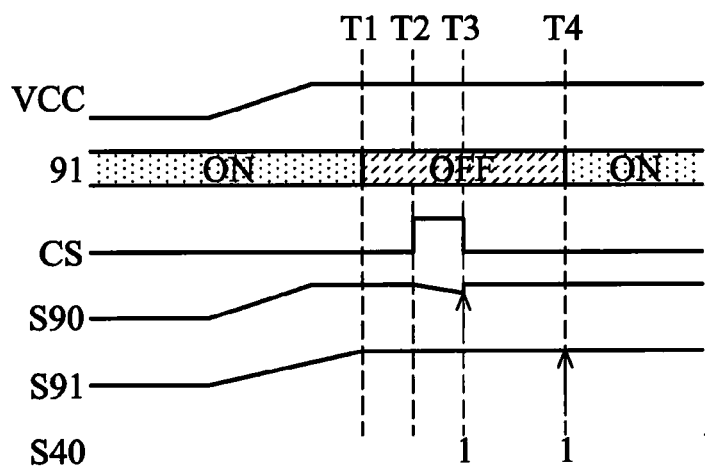
Figure 11C:
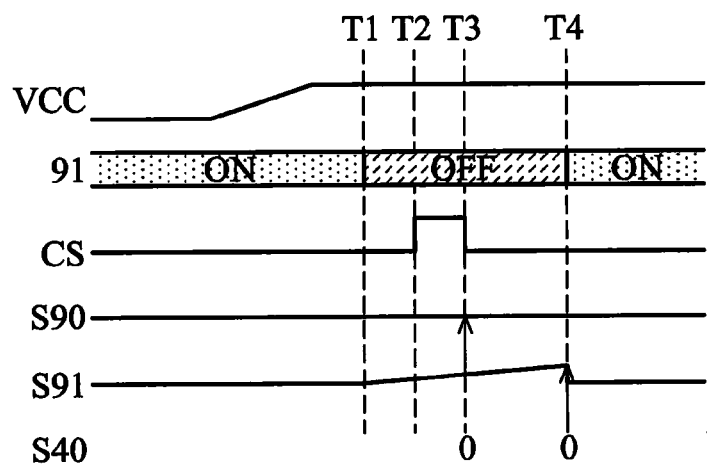
Figure 12:
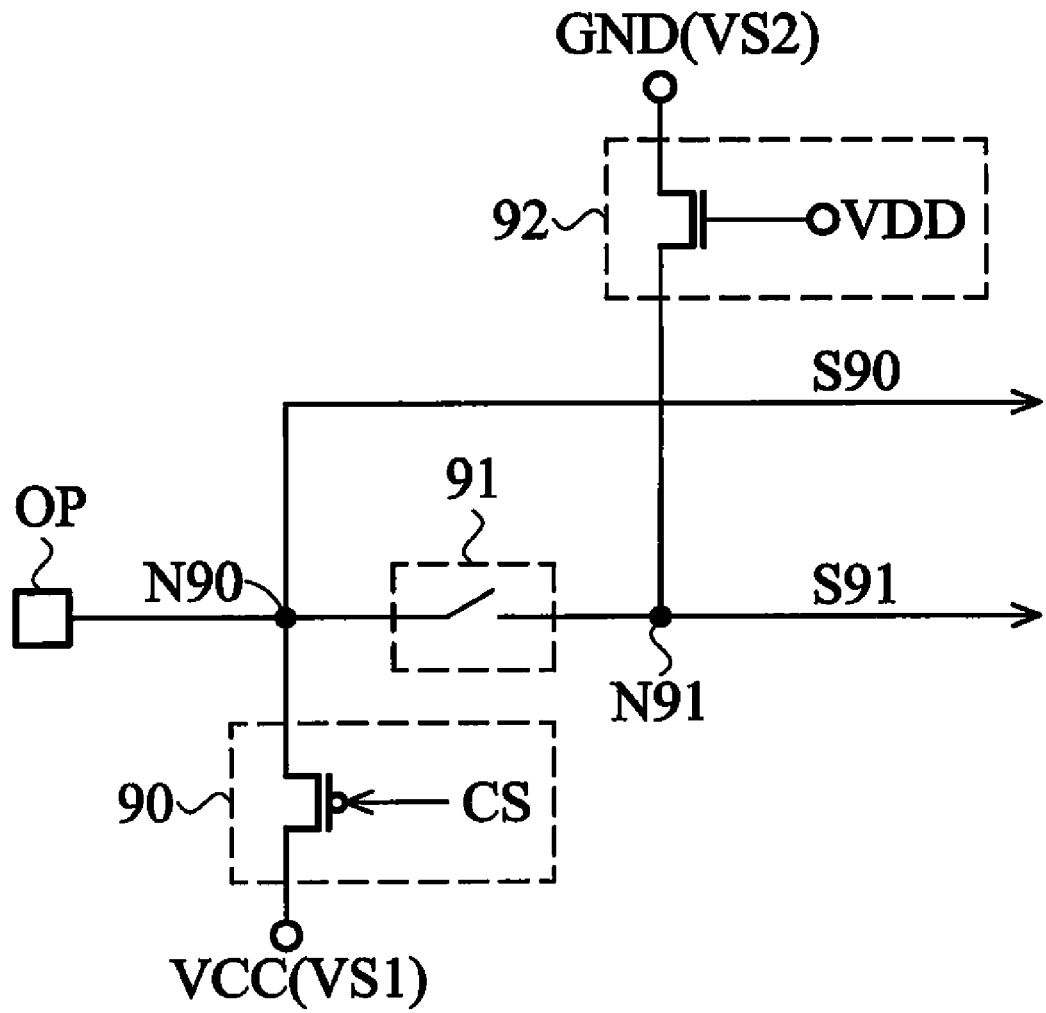
Figure 13A:
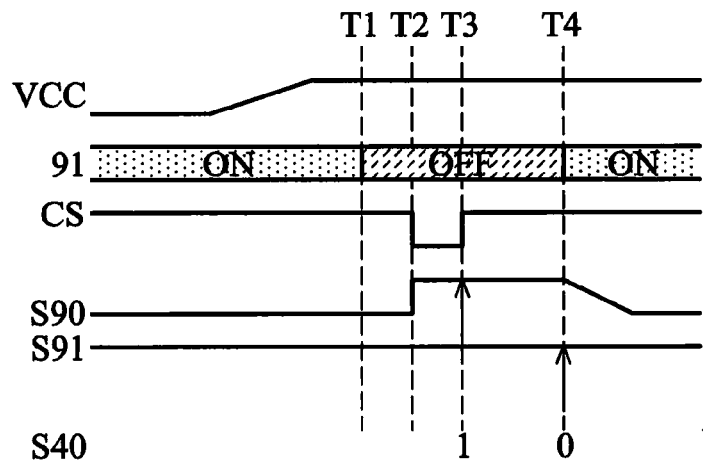
Figure 13B:
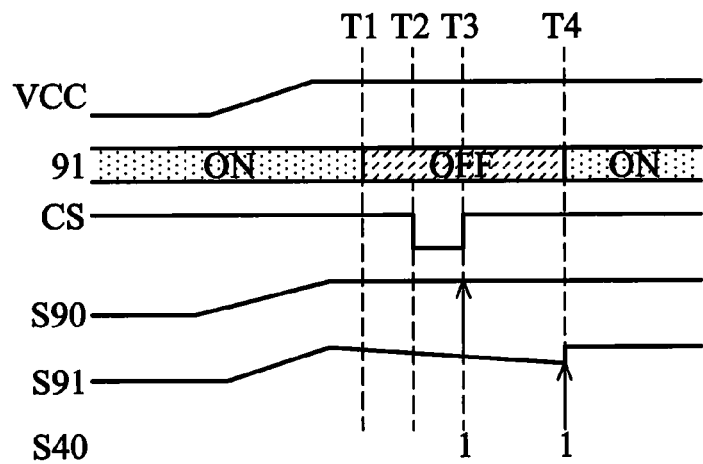
Figure 13C:
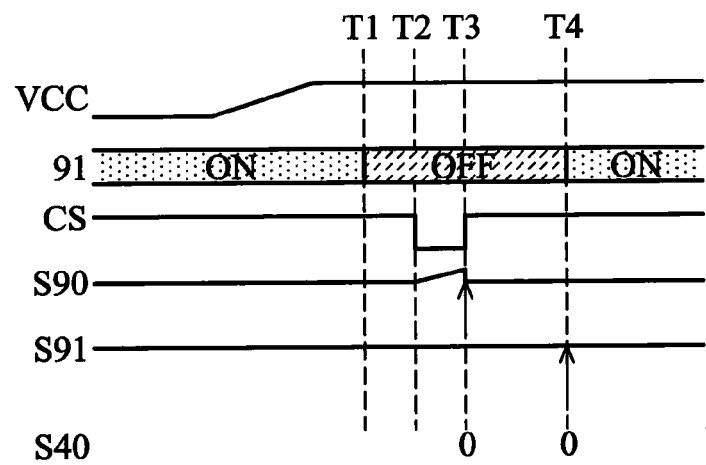

FIG. 7b shows wave forms of the voltage of the voltage source VCC (VS2), the control signal CS, and the detection signal S60 when the memory chip 4 is operating as a top memory die among two stacked memory dies (the second mode) in the embodiment of FIG. 6;

FIG. 7c shows wave forms of the voltage of the voltage source VCC (VS2), the control signal CS, and the detection signal S60 when the memory chip 4 is operating as a bottom memory die among two stacked memory dies (the third mode) in the embodiment of FIG. 6;

FIG. 8 shows another exemplary embodiment of the detection unit 50 in FIG. 5;

FIG. 9a shows wave forms of the voltage of the voltage source VCC (VS1), the control signal CS, and the detection signal S60 and the logic values of the judgment signal S40 when the memory chip 4 is operating as a single memory die (the first mode) in the embodiment of FIG. 8;

FIG. 9b shows wave forms of the voltage of the voltage source VCC (VS1), the control signal CS, and the detection signal S60 when the memory chip 4 is operating as a top memory die among two stacked memory dies (the second mode) in the embodiment of FIG. 8;

FIG. 9c shows wave forms of the voltage of the voltage source VCC (VS1), the control signal CS, and the detection signal S60 when the memory chip 4 is operating as a bottom memory die among two stacked memory dies (the third mode) in the embodiment of FIG. 8;

FIG. 10 shows another exemplary embodiment of the detection unit 50 in FIG. 5;

FIG. 11a shows wave forms of the voltage of the voltage source VCC (VS2), the control signal CS, and the detection signals S90 and S91, the state of the switch element 91, and the logic values of the judgment signal S40 when the memory chip 4 is operating as a single memory die (the first mode) in the embodiment of FIG. 10;

FIG. 11b shows wave forms of the voltage of the voltage source VCC (VS2), the control signal CS, and the detection signals S90 and S91, the state of the switch element 91, and the logic values of the judgment signal S40 when the memory chip 4 is operating as a top memory die among two stacked memory dies (the second mode) in the embodiment of FIG. 10;

FIG. 11c shows wave forms of the voltage of the voltage source VCC (VS2), the control signal CS, and the detection signals S90 and S91, the state of the switch element 91, and the logic values of the judgment signal S40 when the memory chip 4 is operating as a bottom memory die among two stacked memory dies (the third mode) in the embodiment of FIG. 10;

FIG. 12 shows another exemplary embodiment of the detection unit 50 in FIG. 5;

FIG. 13a shows wave forms of the voltage of the voltage source VCC (VS1), the control signal CS, and the detection signals S90 and S91, the state of the switch element 91, and the logic values of the judgment signal S40 when the memory chip 4 is operating as a single memory die (the first mode) in the embodiment of FIG. 12;

FIG. 13b shows wave forms of the voltage of the voltage source VCC (VS1), the control signal CS, and the detection signals S90 and S91, the state of the switch element 91, and the logic values of the judgment signal S40 when the memory chip 4 is operating as a top memory die among two stacked memory dies (the second mode) in the embodiment of FIG. 12; and FIG. 13c shows wave forms of the voltage of the voltage source VCC (VS1), the control signal CS, and the detection signals S90 and S91, the state of the switch element 91, and the logic values of the judgment signal S40 when the memory chip 4 is operating as a bottom memory die among two stacked memory dies (the third mode) in the embodiment of FIG. 12.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Memory chips are provided. In an exemplary embodiment of a memory chip in FIG. 4, a memory chip 4 comprises a plurality of address pads, an option pad OP, a judgment circuit 40, and a control circuit 41. The option pad OP has different statuses. In the embodiment, the option pad OP has three statuses: a floating status, a strong high status, and a strong low status respectively in the three modes. For example, when the option pad OP is floating, the option pad OP is at the floating status. When the option pad OP is tied to a high voltage source VDD, the option pad OP is at the strong high status. When the option pad OP is tied to a low voltage source VSS, the option pad OP is at the strong low status. In the embodiment, the memory chip 4 is a 256 Mb memory chip. Since the memory chip 4 can operate as one memory die among two stacked memory dies of 512 Mb in some applications, the memory chip 4 comprises 24 address pads A0~A23. In other embodiments, the number of address pads of a memory chip is determined according the size of the memory chip.

The judgment circuit 40 is coupled to the option pad OP and generates a judgment signal S40 according to the current status of the option pad OP. Thus, the judgment signal S40 indicates which mode the memory chip 4 is operating at. The control circuit 41 receives the judgment signal S40 and controls the memory chip 4 according to the judgment signal S40. In the embodiment, when the option pad OP is at the floating status, the judgment circuit 40 generates the judgment signal S40 to indicate that the memory chip 4 operates as a single memory die at a first mode. When the option pad OP is at the strong high status, the judgment circuit 40 generates the judgment signal S40 to indicate that the memory chip 4 operates as a top memory die among two stacked memory dies at a second mode. When the option pad OP is at the strong low status, the judgment circuit 40 generates the judgment signal S40 to indicate that the memory chip 4 operates as a bottom memory die among two stacked memory dies at a third mode.

Figure 1:
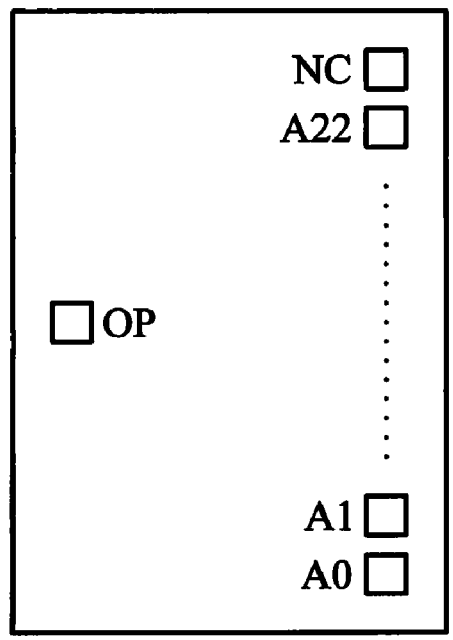
FIG. 1 is a schematic view showing a memory chip.
Figure 2:
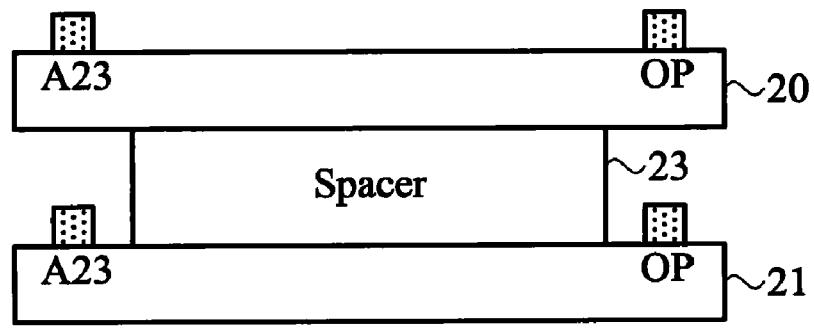
FIG. 2 shows a memory device having two stacked memory chips.
Figure 3:
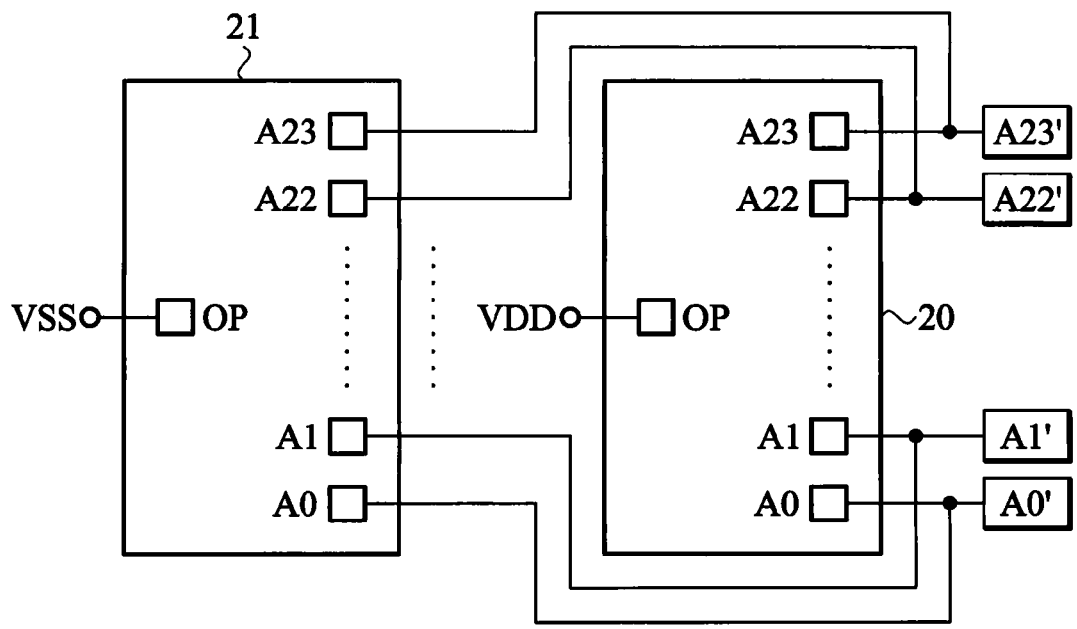
FIG. 3 is a schematic view showing connection between the address pads A0~A23 of the memory chips 20 and 21 in FIG. 2.
Figure 4:
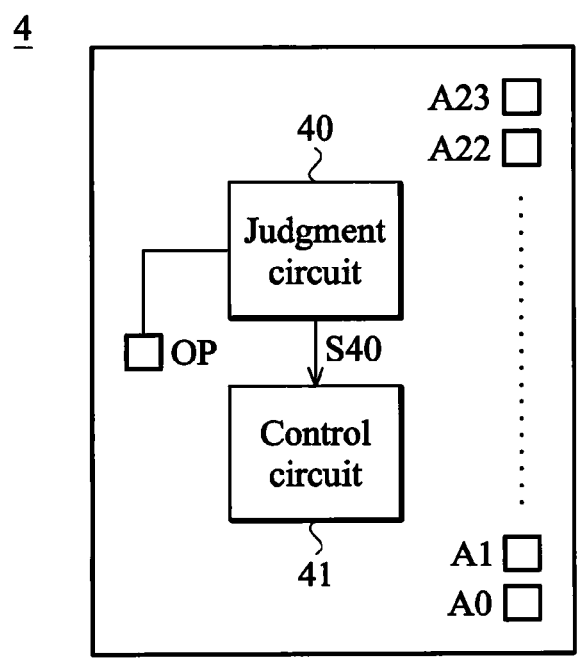
FIG. 4 shows an exemplary embodiment of a memory chip.

FIG. 5 shows an exemplary embodiment of the judgment circuit 40 in FIG. 4. Referring to FIG. 5, the judgment circuit 40 comprises a detection unit 50 and a sampling unit 51. The detection unit 50 is coupled to a voltage source VS1 and the option pad OP. The detection unit 50 is controlled by a control signal CS to generate at least one detection signal according to the current status of the option pad OP. When the control signal is asserted, a level of the at least one detection signal is varied by a voltage provided by the voltage source VS1. The sampling unit 51 receives the at least one detection signal and samples the at least one detection signal after the control signal CS is asserted to generate the judgment signal S40.

FIG. 6 shows an exemplary embodiment of the detection unit 50 in FIG. 5. Referring to FIG. 6, a detection unit 50' is coupled to the option pad OP at a node N60. The detection unit 50' comprises a weak pulling high/low element 60 and a switch element 61. The weak pulling high/low element 60 is coupled between a voltage source VS2 and the node N60. The switch element 61 is coupled between the node N60 and the voltage source VS1 and turned on by the asserted control signal CS. Assume that when the memory chip 4 is operating as a single memory die, that is the memory chip 4 is operating at the first mode, the option pad OP is floating, and the node N60 connected with the option pad OP is weakly pulled high to a high level. Thus, the voltage source VS1 would provide, a low level voltage, such as a ground voltage GND, and the voltage source VS2 would provide a high level voltage, such as an operation voltage VCC. Assume also that in this situation, the weak pulling high/low element 60 is implemented by a PMOS transistor which is always turned on by a low voltage source VSS, and the PMOS transistor has a long channel length. Additionally, the switch element 61 is implemented by an NMOS transistor and turned on according to the asserted control signal CS with a high level. In the embodiment, one detection signal S60 is generated at the node N60 to be sampled by the sampling unit 51.

FIG. 7a shows wave forms of the voltage of the voltage source VCC (VS2), the control signal CS, and the detection signal S60 and the logic values of the judgment signal S40 when the memory chip 4 is operating as a single memory die (the first mode). As described above, when the memory chip 4 operates as a single memory die, the option pad OP is floating. Referring to FIG. 7a, the level of the detection signal S60 is gradually pulled high with the high level voltage VCC of the voltage source VS2. At a time point T1, the control signal CS is switched to a high level from a low level, that is the control signal CS is asserted. The switch element 61 is turned on according to the asserted control signal CS with the high level at the time point T1. Thus, the detection signal S60 is pulled low immediately to the level of the low level voltage GND of the voltage source VS1. The detection signal S60 is continuously at the level of the low level voltage GND of the voltage source VS1 until the control signal CS is switched to the low level from the high level at a time point T2 (i.e. the control signal CS is de-asserted at the time point T2) to turn off the switch element 61. In other words, the detection signal S60 is continuously at the level of the low level voltage GND of the voltage source VS1 when the control signal CS is asserted from the time point T1 to the time point T2. After the time point T2, the detection signal S60 is gradually pulled high with the high level voltage VCC of the voltage source VS2 again. At a time point T3 after the control signal CS is de-asserted for a short period P1, the sampling unit 51 samples the detection signal S60 to obtain a first logic value "0" due to the detection signal S60 being gradually pulled higher from a low level. After the time point T3 for a long period P2, the sampling unit 51 samples the detection signal S60 again to obtain a second logic value at a time point T4. Since the detection signal S60 is at the level of the high level voltage VCC of the voltage source VS2 at the time point T4, the second logic value is logic "1". The first logic value "0" and the second logic value "1" form the judgment signal S40.

According to the description in reference to FIG. 7a, when the memory chip 4 operates as a single memory die, the judgment circuit 40 generates the judgment signal S40 of "01" according to the floating status of the option pad OP.

FIG. 7b shows wave forms of the voltage of the voltage source VCC (VS2), the control signal CS, and the detection signal S60 and the logic values of the judgment signal S40 when the memory chip 4 is operating as a top memory die among two stacked memory dies (the second mode). At the second mode, the option pad OP is tied to the high voltage source VDD. According to the above description, the control signal CS is asserted between the time points T1 and T2, and the sampling unit 51 samples the detection signal S60 twice at the time points T3 and T4 to obtain a first logic value and a second logic value respectively. As shown in FIG. 7b, at the second mode, the first logic value "1" and the second logic value "1" form the judgment signal S40. According to the description in reference to FIG. 7b, when the memory chip 4 operates as a top memory die among two stacked memory dies, the judgment circuit 40 generates the judgment signal S40 of "11" according to the strong high status of the option pad OP.

FIG. 7c shows wave forms of the voltage of the voltage source VCC (VS2), the control signal CS, and the detection signal S60 and the logic values of the judgment signal S40 when the memory chip 4 is operating as a bottom memory die among two stacked memory dies (the third mode). At the third mode, the option pad OP is tied to the low voltage source VSS. According to the above description, the control signal CS is asserted between the time points T1 and T2, and the sampling unit 51 samples the detection signal S60 twice at the time points T3 and T4 to obtain a first logic value and a second logic value respectively. As shown in FIG. 7c, at the third mode, the first logic value "0" and the second logic value "0" form the judgment signal S40. According to the description in reference to FIG. 7c, when the memory chip 4 operates as a bottom memory die among two stacked memory dies, the judgment circuit 40 generates the judgment signal S40 of "00" according to the strong low status of the option pad OP.

In the above embodiment of FIG. 6, when the memory chip 4 operates as a single memory die (the first mode), the option pad OP is floating, and the node N60 connected with the option pad OP is weakly pulled high. In some embodiments, when the memory chip 4 operates as a single memory die (the first mode), the option pad OP is floating, and the node N60 connected with the option pad OP is weakly pulled low.

Thus, the voltage source VS1 provides a high level voltage, such as an operation voltage VCC, and the voltage source VS2 provides a low level voltage, such as a ground voltage GND, as show in FIG. 8. In this situation, the weak pulling high/low element 60 is implemented by an NMOS transistor which is always turned on by a high voltage source VDD, and the NMOS transistor has a long channel length. The switch element 61 is implemented by a PMOS transistor and turned on according to the asserted control signal CS with a low level. According to the timing of the control signal CS and the sampling operation of the sampling unit 51 as shown in FIGS. 9a-9c, the sampling unit 51 of the judgment circuit 40 can generate the judgment signal S40 indicating which mode the memory chip 4 is operating at according to the statuses of the option pad OP. Specifically, the judgment signal S40 can clearly indicate whether the memory chip 4 is operating as a single memory die (the first mode) or as a bottom memory die among two stacked memory dies (the third mode). Note that at both of the first and third modes, the node N60 connected with the option pad OP is eventually pulled to a low level.

FIG. 10 shows another exemplary embodiment of the detection unit 50 in FIG. 5. Referring to FIG. 10, a detection unit 50" is coupled to the option pad OP at a node N90. The detection unit 50" comprises switch elements 90 and 91 and a weak pulling high/low element 92. The switch element 90 is coupled between the node N90 and the voltage source VS1 and turned on by the asserted control signal CS. The switch element 91 is coupled between the node N90 and a node N91. The weak pulling high/low element 92 is coupled between a voltage source VS2 and the node N91. Assume that when the memory chip 4 operates as a single memory die, that is the memory chip 4 operates at the first mode, the option pad OP is floating, and the node N90 connected with the option pad OP is weakly pulled higher to a high level. Thus, the voltage source VS1 would provide a low level voltage, such as a ground voltage GND, and the voltage source VS2 would provide a high level voltage, such as an operation voltage VCC. Assume also that, in this situation, the weak pulling high/low element 92 is implemented by a PMOS transistor which is always turned on by a low voltage source VSS, and the PMOS transistor has a long channel length. Additionally, the switch element 90 is implemented by an NMOS transistor and turned on according to the asserted control signal CS with a high level. In the embodiment, one detection signal S90 is generated at the node N90, and the other detection signal S91 is generated at the node N91. The detection signals S90 and S91 are sampled by the sampling unit 51.

FIG. 11a shows wave forms of the voltage of the voltage source VCC (VS2), the control signal CS, and the detection signals S90 and S91, the state of the switch element 91, and the logic values of the judgment signal S40 when the memory chip 4 is operating as a single memory die (the first mode). As described above, when the memory chip 4 operates as a single memory die, the option pad OP is floating. Referring to FIG. 11a, the switch element 91 is turned on in the period before a time point T1. The levels of the detection signals S90 and S91 are gradually pulled high with the high level voltage VCC of the voltage source VS2 and reach the level of the high level voltage VCC before the time point T1. At time point T1, the switch element 91 is turned off. The detection signal S90 is continuously at the level of the high level voltage VCC until the control signal CS is switched to a high level from a low level at a time point T2 (i.e. the control signal CS is asserted at the time point T2) to turn on the switch element 90. At the time point T2, since the control signal CS is asserted, the detection signal S90 is pulled low immediately to the level of the low level voltage GND of the voltage source VS1. At a time point T3, the control signal CS is switched to the low level from the high level (i.e. the control signal CS is de-asserted at the time point T3) to turn off the switch element 90. At this time, since the switch element 91 is still turned off, the detection signal S90 is not pulled high with the high level voltage VCC, and the detection signal S90 is continuously at the level of the low level voltage GND of the voltage source VS1. The sampling unit 51 samples the detection signal S90 at the time point T3 (after the control signal CS is asserted) to obtain a first logic value "0". At a time point T4, the switch element 91 is turned on. Due to the turned-on switch element 91, the level of the detection signal S90 is gradually pulled high with the high level voltage VCC. Moreover, as shown in FIG. 11a, in the period between the time points T1 and T4, since the switch element 91 is turned off, the detection signal S91 is not affected by the low level voltage GND, and the detection signal S91 is continuously at the level of the high level voltage VCC. The sampling unit 51 samples the detection signal S91 at the time point T4 to obtain a second logic value "1". The first logic value "0" and the second logic value "1" form the judgment signal S40.

According to the description in reference to FIG. 11a, when the memory chip 4 operates as a single memory die, the judgment circuit 40 generates the judgment signal S40 of "01" according to the floating status of the option pad OP.

FIG. 11b shows wave forms of the voltage of the voltage source VCC (VS2), the control signal CS, and the detection signals S90 and S91, the state of the switch element 91, and the logic values of the judgment signal S40 when the memory chip 4 is operating as a top memory die among two stacked memory dies (the second mode). At the second mode, the option pad OP is tied to the high voltage source VDD. According to the above description, the control signal CS is asserted between the time points T2 and T3, the state switching of the switch element 91 occurs at the time points T1 and T4, and the sampling unit 51 samples the detection signals S90 and S91 at the time points T3 and T4 to obtain a first logic value and a second logic value respectively. As shown in FIG. 11b, at the second mode, the first logic value "1" and the second logic value "1" form the judgment signal S40. According to the description in reference to FIG. 111b, when the memory chip 4 operates as a top memory die among two stacked memory dies, the judgment circuit 40 generates the judgment signal S40 of "11" according to the strong high status of the option pad OP.

FIG. 11c shows wave forms of the voltage of the voltage source VCC (VS2), the control signal CS, and the detection signals S90 and S91, the state of the switch element 91, and the logic values of the judgment signal S40 when the memory chip 4 is operating as a bottom memory die among two stacked memory dies (the third mode). At the third mode, the option pad OP is tied to the low voltage source VSS. According to the above description, the control signal CS is asserted between the time points T2 and T3, occurs at the time points T1 and T4, and the state switching of the switch element 91, and the sampling unit 51 samples the detection signal S60 twice at the time points T3 and T4 to obtain a first logic value and a second logic value respectively. As shown in FIG. 11c, at the second mode, the first logic value "0" and the second logic value "0" form the judgment signal S40. According to the description in reference to FIG. 11c, when the memory chip 4 operates as a bottom memory die among two stacked memory dies, the judgment circuit 40 generates the judgment signal S40 of "00" according to the strong low status of the option pad OP.

According to the above embodiment, the sampling unit 51 of the judgment circuit 40 can generate the judgment signal S40 indicating which mode the memory chip 4 is operating at according to the statuses of the option pad OP. Specifically, the judgment signal S40 can clearly indicate whether the memory chip 4 is operating as a single memory die (the first mode) or as a top memory die among two stacked memory dies (the second mode). Note that at both of the first and second modes, the node N90 connected with the option pad OP is eventually pulled to a high level.

In the above embodiment of FIG. 10, when the memory chip 4 operates as a single memory die (the first mode), the option pad OP is floating, and the node N90 connected with the option pad OP is weakly pulled high. In some embodiments, when the memory chip 4 operates as a single memory die (the first mode), the option pad OP is floating, and the node N90 connected with the option pad OP is weakly pulled low.

Thus, the voltage source VS1 provides a high level voltage, such as an operation voltage VCC, and the voltage source VS2 provides a low level voltage, such as a ground voltage GND, as show in FIG. 12. In this situation, the weak pulling high/low element 92 is implemented by an NMOS transistor which is always turned on by a high voltage source VDD, and the NMOS transistor has a long channel length. The switch element 90 is implemented by a PMOS transistor and turned on according to the asserted control signal CS with a low level. According to the timing of the control signal CS, the switching operation of the switch element 91, and the sampling operation of the sampling unit 51 as shown in FIGS. 13a-13c, the sampling unit 51 of the judgment circuit 40 can generate the judgment signal S40 indicating which mode the memory chip 4 is operating at according to the statuses of the option pad OP. Specifically, the judgment signal S40 can clearly indicate whether the memory chip 4 is operating as a single memory die (the first mode) or as a bottom memory die among two stacked memory dies (the third mode). Note that at both of the first and third modes, the node N90 connected with the option pad OP is eventually pulled to a low level.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A memory chip operating at a plurality of modes comprising:
   an option pad having a plurality of statuses; and
   a judgment circuit, coupled to the option pad, for generating a judgment signal according to the current status of the option pad, wherein the judgment signal indicates which mode the memory chip is operating at, and the judgment circuit comprises:
      a detection unit coupled to a first voltage source and the option pad and controlled by a control signal to generate at least one detection signal according to the current status of the option pad; and
      a sampling unit for receiving the at least one detection signal and sampling the at least one detection signal after the control signal is asserted to generate the judgment signal;
      wherein when the control signal is asserted, a level of the at least one detection signal is varied by a voltage provided by the first voltage source.

2. The memory chip as claimed in claim 1 further comprising a control circuit for receiving the judgment signal and controlling the memory chip according to the judgment signal.

3. The memory chip as claimed in claim 1, wherein the detection unit is coupled to the option pad at a first node and comprises:
   a weak pulling high/low element coupled between a second voltage source and the first node; and
   a switch element coupled between the first node and the first voltage source and turned on by the asserted control signal;
   wherein a first detection signal is generated at the first node to serve as the at least one detection signal.

4. The memory chip as claimed in claim 3, wherein the weak pulling high/low element is implemented by a PMOS transistor which is always turned on, the voltage provided by the first voltage source has a low level, and a voltage provided by the second voltage source has a high level.

5. The memory chip as claimed in claim 3, wherein the weak pulling high/low element is implemented by an NMOS transistor which is always turned on, the voltage provided by the first voltage source has a high level, and a voltage provided by the second voltage source has a low level.

6. The memory chip as claimed in claim 3, wherein after the control signal is asserted, the sampling unit samples the first detection signal twice to obtain two logic values, and the two logic values form the judgment signal.

7. The memory chip as claimed in claim 1, wherein the detection unit is coupled to the option pad at a first node and comprises:
   a first switch element coupled between the first node and the first voltage source and turned on by the asserted control signal;
   a second switch element coupled between the first node and a second node, wherein the second switch element is turned on in a first period and turned off in a second period; and
   a weak pulling high/low element coupled between a second voltage source and the second node;
   wherein a first detection signal is generated at the first node, and a second detection signal is generated at the second node.

8. The memory chip as claimed in claim 7, wherein the weak pulling high/low element is implemented by a PMOS transistor which is always turned on, the voltage provided by the first voltage source has a low level, and a voltage provided by the second voltage source has a high level.

9. The memory chip as claimed in claim 7, wherein the weak pulling high/low element is implemented by an NMOS transistor which is always turned on, the voltage provided by the first voltage source has a high level, and a voltage provided by the second voltage source has a low level.

10. The memory chip as claimed in claim 7, wherein the control signal is asserted in the second period, and after the control signal is asserted, the sampling unit samples the first detection signal to obtain a first logic value and samples the second detection signal to obtain a second logic value, and the first and second logic values form the judgment signal.

11. The memory chip as claimed in claim 1, wherein the option pad has a floating status, a strong high status, and a strong low status at three modes respectively.

12. The memory chip as claimed in claim 11, wherein the memory chip operates as a single memory die, a top memory die among two stacked memory dies, and a bottom memory die among two stacked memory dies at the three modes respectively.

* * * * *